United States Patent
Edwards et al.

(10) Patent No.: US 10,930,801 B2
(45) Date of Patent: Feb. 23, 2021

(54) TRANSACTION CARD FOR TRANSFERRING SOLAR POWER

(71) Applicant: Capital One Services, LLC, McLean, VA (US)

(72) Inventors: Joshua Edwards, Philadelphia, PA (US); Daniel Herrington, New York, NY (US)

(73) Assignee: Capital One Services, LLC, McLean, VA (US)

(*) Notice: Subject to any disclaimer, the term of this patent is extended or adjusted under 35 U.S.C. 154(b) by 0 days.

(21) Appl. No.: 16/289,319

(22) Filed: Feb. 28, 2019

(65) Prior Publication Data
US 2019/0198683 A1    Jun. 27, 2019

Related U.S. Application Data

(63) Continuation of application No. 15/850,686, filed on Dec. 21, 2017, now Pat. No. 10,243,088.

(51) Int. Cl.
| | |
|---|---|
| *H02J 7/02* | (2016.01) |
| *G07F 7/08* | (2006.01) |
| *H01L 31/02* | (2006.01) |
| *H01L 31/048* | (2014.01) |
| *G06K 19/07* | (2006.01) |
| *H02S 20/30* | (2014.01) |
| *H02S 40/38* | (2014.01) |
| *G06K 19/06* | (2006.01) |

(Continued)

(52) U.S. Cl.
CPC .. *H01L 31/02008* (2013.01); *G06K 19/06187* (2013.01); *G06K 19/0704* (2013.01); *G06K 19/0707* (2013.01); *G06K 19/0723* (2013.01); *G07F 7/08* (2013.01); *G07F 7/0806* (2013.01); *G07F 7/0833* (2013.01); *H01L 31/048* (2013.01); *H02J 7/025* (2013.01); *H02J 7/35* (2013.01); *H02S 20/30* (2014.12); *H02S 40/30* (2014.12); *H02S 40/38* (2014.12)

(58) Field of Classification Search
CPC .. H01L 31/02008; H01L 31/048; H02J 7/355; G06K 19/0704; G07F 7/08
USPC ........................................................ 320/101
See application file for complete search history.

(56) References Cited

U.S. PATENT DOCUMENTS

| | | |
|---|---|---|
| 3,971,916 A | 7/1976 | Moreno et al. |
| 4,614,861 A | 9/1986 | Pavlov et al. |

(Continued)

FOREIGN PATENT DOCUMENTS

DE    102006027175 A1    12/2007

OTHER PUBLICATIONS

Sunny, "It is Well," https://sunnycase.com/blogs/news, 2017, 6 pages.

(Continued)

*Primary Examiner* — John T Trischler
(74) *Attorney, Agent, or Firm* — Harrity & Harrity, LLP (57) ABSTRACT

A transaction card is provided for communicating data relating to a transaction. The transaction card includes a solar layer, a transaction card layer, and a power transfer layer. The solar layer includes at least one solar panel capable of converting light into electricity, the transaction card layer supports the solar layer and includes a magnetic strip, and the power transfer layer includes circuitry capable of receiving electricity from the solar layer.

19 Claims, 7 Drawing Sheets

(51) Int. Cl.
*H02S 40/30* (2014.01)
*H02J 7/35* (2006.01)

(56) References Cited

U.S. PATENT DOCUMENTS

| | | | |
|---|---|---|---|
| 4,650,981 A * | 3/1987 | Foletta | G06K 19/0723 |
| | | | 235/380 |
| 4,668,314 A * | 5/1987 | Endoh | G06F 15/0216 |
| | | | 156/267 |
| 4,692,601 A | 9/1987 | Nakano et al. | |
| 4,740,431 A | 4/1988 | Little et al. | |
| 4,742,351 A | 5/1988 | Suzuki et al. | |
| 4,749,982 A | 6/1988 | Rikuna et al. | |
| 4,754,418 A | 6/1988 | Hara et al. | |
| 4,797,542 A | 1/1989 | Hara et al. | |
| 4,801,787 A | 1/1989 | Suzuki et al. | |
| 4,812,634 A | 3/1989 | Ohta et al. | |
| 4,864,109 A | 9/1989 | Minematsu et al. | |
| 4,868,376 A | 9/1989 | Lessin et al. | |
| 4,916,296 A | 4/1990 | Streck et al. | |
| 4,918,631 A | 4/1990 | Hara et al. | |
| 4,954,985 A | 9/1990 | Yamazaki et al. | |
| 5,034,599 A | 7/1991 | Hirata et al. | |
| 5,146,068 A | 9/1992 | Ugawa et al. | |
| 5,247,164 A | 9/1993 | Takahashi et al. | |
| 5,484,997 A | 1/1996 | Haynes et al. | |
| 5,539,819 A | 7/1996 | Sonoyama et al. | |
| 5,585,787 A | 12/1996 | Wallerstein et al. | |
| 5,600,362 A | 2/1997 | Morgavi et al. | |
| 5,627,355 A | 5/1997 | Rahman et al. | |
| 5,679,939 A | 10/1997 | Watanabe et al. | |
| 5,777,903 A | 7/1998 | Piosenka et al. | |
| 5,789,732 A | 8/1998 | McMahon et al. | |
| 5,817,207 A | 10/1998 | Leighton et al. | |
| 5,834,747 A | 11/1998 | Cooper et al. | |
| 5,886,333 A | 3/1999 | Miyake et al. | |
| 5,889,267 A | 3/1999 | Robin et al. | |
| 5,907,142 A | 5/1999 | Kelsey et al. | |
| 5,939,699 A | 8/1999 | Perttunen et al. | |
| 5,955,961 A | 9/1999 | Wallerstein et al. | |
| 5,963,012 A | 10/1999 | Garcia et al. | |
| 6,005,183 A | 12/1999 | Akai et al. | |
| 6,019,284 A | 2/2000 | Freeman et al. | |
| 6,029,892 A | 2/2000 | Miyake et al. | |
| 6,036,099 A | 3/2000 | Leighton et al. | |
| 6,079,621 A | 6/2000 | Vardanyan et al. | |
| 6,134,130 A * | 10/2000 | Connell | G06K 19/0701 |
| | | | 363/89 |
| 6,214,155 B1 | 4/2001 | Leighton et al. | |
| 6,257,486 B1 | 7/2001 | Teicher et al. | |
| 6,308,890 B1 | 10/2001 | Cooper et al. | |
| 6,325,284 B1 | 12/2001 | Walker et al. | |
| 6,394,343 B1 | 5/2002 | Berg et al. | |
| 6,402,039 B1 | 6/2002 | Freeman et al. | |
| 6,427,909 B1 | 8/2002 | Barnes et al. | |
| 6,427,910 B1 | 8/2002 | Barnes et al. | |
| 6,427,911 B1 | 8/2002 | Barnes et al. | |
| 6,431,443 B1 | 8/2002 | Barnes et al. | |
| 6,476,311 B1 | 11/2002 | Lee et al. | |
| 6,502,748 B2 | 1/2003 | Berg et al. | |
| 6,514,367 B1 | 2/2003 | Leighton et al. | |
| 6,538,341 B1 * | 3/2003 | Lang | H02J 2207/20 |
| | | | 307/18 |
| 6,561,430 B2 | 5/2003 | Ou et al. | |
| 6,631,849 B2 | 10/2003 | Blossom et al. | |
| 6,739,505 B2 | 5/2004 | Walker et al. | |
| 6,764,005 B2 | 7/2004 | Cooper et al. | |
| 6,924,164 B2 * | 8/2005 | Jenson | C23C 14/0676 |
| | | | 438/48 |
| 6,966,497 B1 | 11/2005 | Hohmann et al. | |
| 6,977,479 B2 | 12/2005 | Hsu | |
| 6,991,155 B2 | 1/2006 | Burchette, Jr. et al. | |
| 7,025,277 B2 | 4/2006 | Forrest et al. | |
| 7,083,094 B2 | 8/2006 | Cooper et al. | |
| 7,090,123 B2 * | 8/2006 | Walker | G06K 7/10079 |
| | | | 235/380 |
| 7,155,416 B2 | 12/2006 | Shatford et al. | |
| 7,163,153 B2 | 1/2007 | Blossom et al. | |
| 7,191,952 B2 | 3/2007 | Blossom et al. | |
| 7,219,844 B2 | 5/2007 | Dischamp et al. | |
| 7,306,158 B2 | 12/2007 | Berardi et al. | |
| 7,334,732 B2 | 2/2008 | Cooper et al. | |
| RE40,145 E | 3/2008 | Leighton et al. | |
| 7,357,331 B2 | 4/2008 | Blossom et al. | |
| 7,440,771 B2 | 10/2008 | Purk et al. | |
| 7,518,692 B2 * | 4/2009 | Yamazaki | G06K 19/077 |
| | | | 349/151 |
| 7,530,495 B2 | 5/2009 | Cooper et al. | |
| 7,591,416 B2 | 9/2009 | Blossom et al. | |
| 7,606,771 B2 | 10/2009 | Keresman, III et al. | |
| 7,607,583 B2 | 10/2009 | Berardi et al. | |
| 7,681,232 B2 | 3/2010 | Nordentoft et al. | |
| 7,743,982 B2 | 6/2010 | Reynolds et al. | |
| 7,784,687 B2 | 8/2010 | Mullen et al. | |
| 7,806,320 B2 * | 10/2010 | Walker | G07F 7/086 |
| | | | 235/380 |
| 7,810,165 B2 * | 10/2010 | Hammad | G06Q 20/085 |
| | | | 726/36 |
| 7,828,207 B2 | 11/2010 | Cooper et al. | |
| 7,967,214 B2 | 6/2011 | Landau et al. | |
| 7,975,927 B1 | 7/2011 | Whitney et al. | |
| 7,988,044 B2 * | 8/2011 | Walker | G07F 7/086 |
| | | | 235/380 |
| 8,015,592 B2 | 9/2011 | Doughty et al. | |
| 8,020,775 B2 | 9/2011 | Mullen et al. | |
| 8,025,226 B1 | 9/2011 | Hopkins, III et al. | |
| 8,070,057 B2 * | 12/2011 | Jain | G06Q 20/352 |
| | | | 235/380 |
| 8,074,877 B2 | 12/2011 | Mullen et al. | |
| 8,103,881 B2 | 1/2012 | Doughty et al. | |
| 8,276,823 B2 | 10/2012 | Chen et al. | |
| 8,324,857 B1 * | 12/2012 | Chang | H02J 7/0021 |
| | | | 320/101 |
| 8,370,254 B1 | 2/2013 | Hopkins, III et al. | |
| 8,382,000 B2 | 2/2013 | Mullen et al. | |
| 8,393,547 B2 * | 3/2013 | Kiekhaefer | G06K 19/07749 |
| | | | 235/492 |
| 8,413,892 B2 | 4/2013 | Mullen et al. | |
| 8,424,773 B2 | 4/2013 | Mullen et al. | |
| 8,429,078 B2 * | 4/2013 | Evans | G06K 9/00187 |
| | | | 705/44 |
| 8,485,437 B2 | 7/2013 | Mullen et al. | |
| 8,490,872 B2 | 7/2013 | Kim et al. | |
| 8,490,875 B2 | 7/2013 | Cooper et al. | |
| 8,594,567 B2 * | 11/2013 | Finkenzeller | G06K 7/0008 |
| | | | 455/41.2 |
| 8,608,084 B2 | 12/2013 | Klaas et al. | |
| 8,628,021 B2 | 1/2014 | Jones et al. | |
| 8,632,005 B2 * | 1/2014 | Walker | G06K 19/07345 |
| | | | 235/380 |
| 8,702,005 B2 | 4/2014 | Peters et al. | |
| 8,733,638 B2 | 5/2014 | Mullen et al. | |
| 8,751,400 B2 * | 6/2014 | Evans | G06K 9/00187 |
| | | | 705/44 |
| 8,783,578 B2 | 7/2014 | Kim et al. | |
| 8,820,638 B1 | 9/2014 | Cotter et al. | |
| 8,931,704 B2 | 1/2015 | Morrill Webb et al. | |
| 9,004,368 B2 | 4/2015 | Mullen et al. | |
| 9,010,630 B2 | 4/2015 | Mullen et al. | |
| 9,016,584 B2 * | 4/2015 | Doughty | G07F 7/10 |
| | | | 235/487 |
| 9,065,893 B2 | 6/2015 | Glaser et al. | |
| 9,076,142 B2 * | 7/2015 | Adolphe | G06Q 20/3674 |
| 9,122,966 B2 | 9/2015 | Glaser et al. | |
| 9,135,546 B2 * | 9/2015 | Kargl et al. | |
| 9,152,911 B2 * | 10/2015 | Jain | G07F 7/1008 |
| 9,159,014 B2 | 10/2015 | Narendra et al. | |
| 9,165,295 B2 | 10/2015 | Kim et al. | |
| 9,177,133 B1 | 11/2015 | Toth et al. | |
| 9,189,723 B2 | 11/2015 | Kim et al. | |
| 9,195,931 B2 * | 11/2015 | Jain | H04M 15/77 |
| 9,208,424 B2 | 12/2015 | Narendra et al. | |

(56) References Cited

U.S. PATENT DOCUMENTS

| | | | |
|---|---|---|---|
| 9,219,527 B2* | 12/2015 | Yun | G06K 7/10237 |
| 9,324,071 B2 | 4/2016 | Faith et al. | |
| 9,396,468 B2 | 7/2016 | Papagrigoriou | |
| 9,486,139 B2 | 11/2016 | Charles, Jr. et al. | |
| 9,489,609 B2 | 11/2016 | Glaser et al. | |
| 9,601,268 B2* | 3/2017 | Kapoor et al. | |
| 9,615,079 B2 | 4/2017 | Takahashi et al. | |
| 9,654,470 B2 | 5/2017 | Lazzaro et al. | |
| 9,684,861 B2 | 6/2017 | Mullen et al. | |
| 9,697,388 B1* | 7/2017 | Jacobson | G06K 19/025 |
| 9,697,454 B2 | 7/2017 | Mullen et al. | |
| 9,704,089 B2 | 7/2017 | Mullen et al. | |
| 9,705,556 B2* | 7/2017 | Bosenko | H04B 5/0031 |
| 9,712,802 B2* | 7/2017 | Takahashi | H04N 13/282 |
| 9,727,759 B1* | 8/2017 | Essebag | G06K 7/10297 |
| 9,805,297 B2 | 10/2017 | Mullen et al. | |
| 9,978,058 B2 | 5/2018 | Wurmfeld et al. | |
| 10,127,489 B2* | 11/2018 | Cox | G06K 19/07722 |
| 10,474,941 B2* | 11/2019 | Wurmfeld | G06Q 20/341 |
| 10,483,771 B1* | 11/2019 | Wurmfeld | G06K 19/0704 |
| 10,546,444 B2* | 1/2020 | Osborn | G06Q 20/3829 |
| 10,572,791 B2* | 2/2020 | Wurmfeld | G06K 19/07733 |
| 10,601,232 B1* | 3/2020 | Wurmfeld | H02J 50/12 |
| 10,643,046 B2* | 5/2020 | Yoshida | G06F 3/03545 |
| 10,762,502 B1* | 9/2020 | Yoshida | G06Q 20/00 |
| 10,783,426 B2* | 9/2020 | Finn | H01Q 1/2216 |
| 2002/0003169 A1 | 1/2002 | Cooper et al. | |
| 2002/0088863 A1 | 7/2002 | Ou et al. | |
| 2002/0120583 A1 | 8/2002 | Keresman et al. | |
| 2002/0130187 A1 | 9/2002 | Berg et al. | |
| 2002/0190121 A1 | 12/2002 | Walker et al. | |
| 2003/0019942 A1 | 1/2003 | Blossom et al. | |
| 2003/0128010 A1 | 7/2003 | Hsu | |
| 2004/0041711 A1 | 3/2004 | Loewidt et al. | |
| 2004/0050930 A1 | 3/2004 | Rowe et al. | |
| 2004/0118930 A1 | 6/2004 | Berardi et al. | |
| 2004/0133787 A1 | 7/2004 | Doughty et al. | |
| 2004/0171406 A1 | 9/2004 | Purk et al. | |
| 2004/0238625 A1* | 12/2004 | Walker | G06K 19/0716 |
| | | | 235/380 |
| 2004/0251303 A1 | 12/2004 | Cooper et al. | |
| 2005/0001041 A1 | 1/2005 | McCarthy et al. | |
| 2005/0001711 A1* | 1/2005 | Doughty | G06Q 20/40145 |
| | | | 340/5.74 |
| 2005/0182927 A1 | 8/2005 | Shatford et al. | |
| 2005/0194452 A1 | 9/2005 | Nordentoft et al. | |
| 2005/0284513 A1 | 12/2005 | Brabec et al. | |
| 2006/0176410 A1* | 8/2006 | Nose | G06K 19/07769 |
| | | | 349/1 |
| 2006/0213972 A1* | 9/2006 | Kelley | G06Q 20/3415 |
| | | | 235/380 |
| 2006/0289632 A1* | 12/2006 | Walker | G06K 19/07703 |
| | | | 235/380 |
| 2007/0143544 A1 | 6/2007 | Lin et al. | |
| 2007/0175983 A1 | 8/2007 | Klug et al. | |
| 2007/0189581 A1 | 8/2007 | Nordentoft et al. | |
| 2007/0220272 A1 | 9/2007 | Campisi et al. | |
| 2008/0001577 A1 | 1/2008 | Sather et al. | |
| 2008/0067247 A1* | 3/2008 | McGregor | G06K 19/0704 |
| | | | 235/439 |
| 2008/0126260 A1 | 5/2008 | Cox et al. | |
| 2008/0156885 A1 | 7/2008 | Landau et al. | |
| 2008/0173717 A1 | 7/2008 | Antebi et al. | |
| 2008/0203172 A1 | 8/2008 | Berardi et al. | |
| 2008/0319912 A1 | 12/2008 | Faith et al. | |
| 2009/0108079 A1 | 4/2009 | Reynolds et al. | |
| 2009/0159673 A1 | 6/2009 | Mullen et al. | |
| 2009/0159688 A1 | 6/2009 | Mullen et al. | |
| 2009/0159694 A1 | 6/2009 | Rikkola et al. | |
| 2009/0159700 A1 | 6/2009 | Mullen et al. | |
| 2009/0159701 A1 | 6/2009 | Mullen et al. | |
| 2009/0159706 A1 | 6/2009 | Mullen et al. | |
| 2009/0159707 A1 | 6/2009 | Mullen et al. | |
| 2009/0159708 A1 | 6/2009 | Mullen et al. | |
| 2009/0159712 A1 | 6/2009 | Mullen et al. | |
| 2009/0159713 A1 | 6/2009 | Mullen et al. | |
| 2009/0240625 A1 | 9/2009 | Faith et al. | |
| 2009/0289936 A1 | 11/2009 | Sheedy et al. | |
| 2010/0012721 A1* | 1/2010 | Jain | G06Q 20/3574 |
| | | | 235/380 |
| 2010/0016681 A1 | 1/2010 | Charles, Jr. et al. | |
| 2010/0063922 A1* | 3/2010 | Evans | G06Q 20/40 |
| | | | 705/40 |
| 2010/0230487 A1 | 9/2010 | Johnson et al. | |
| 2010/0264211 A1* | 10/2010 | Jain | G06K 7/10336 |
| | | | 235/380 |
| 2011/0017837 A1* | 1/2011 | Walker | G06K 19/0716 |
| | | | 235/492 |
| 2011/0018490 A1* | 1/2011 | Furuya | G06K 19/0701 |
| | | | 320/101 |
| 2011/0028184 A1 | 2/2011 | Cooper et al. | |
| 2011/0147461 A1 | 6/2011 | Chen et al. | |
| 2011/0208648 A1 | 8/2011 | Alothaimeen et al. | |
| 2011/0240748 A1 | 10/2011 | Doughty et al. | |
| 2011/0272466 A1 | 11/2011 | Mullen et al. | |
| 2011/0272467 A1 | 11/2011 | Mullen et al. | |
| 2011/0272477 A1 | 11/2011 | Mullen et al. | |
| 2011/0272484 A1 | 11/2011 | Mullen et al. | |
| 2011/0276380 A1 | 11/2011 | Mullen et al. | |
| 2011/0276381 A1 | 11/2011 | Mullen et al. | |
| 2012/0024945 A1 | 2/2012 | Jones et al. | |
| 2012/0061466 A1* | 3/2012 | Jain | G06Q 20/382 |
| | | | 235/380 |
| 2012/0074231 A1* | 3/2012 | Jain | H04B 1/3818 |
| | | | 235/492 |
| 2012/0083921 A1 | 4/2012 | Dronen et al. | |
| 2012/0111949 A1 | 5/2012 | Klaas et al. | |
| 2012/0217306 A1 | 8/2012 | Morrill Webb et al. | |
| 2012/0254038 A1 | 10/2012 | Mullen et al. | |
| 2012/0280037 A1 | 11/2012 | Pan et al. | |
| 2012/0284121 A1 | 11/2012 | Pan et al. | |
| 2012/0286035 A1* | 11/2012 | Walker | G07F 7/08 |
| | | | 235/380 |
| 2012/0286930 A1 | 11/2012 | Kim et al. | |
| 2012/0318863 A1 | 12/2012 | Kim et al. | |
| 2012/0325905 A1 | 12/2012 | Kim et al. | |
| 2013/0080322 A1* | 3/2013 | Adolphe | G06Q 20/3674 |
| | | | 705/41 |
| 2013/0085887 A1 | 4/2013 | Zhang et al. | |
| 2013/0246271 A1* | 9/2013 | Evans | G06Q 20/40 |
| | | | 705/44 |
| 2013/0282575 A1 | 10/2013 | Mullen et al. | |
| 2013/0285593 A1 | 10/2013 | Chu et al. | |
| 2013/0297503 A1 | 11/2013 | McGowan et al. | |
| 2013/0342647 A1 | 12/2013 | Takahashi et al. | |
| 2014/0026213 A1 | 1/2014 | Antebi et al. | |
| 2014/0074696 A1 | 3/2014 | Glaser et al. | |
| 2014/0081872 A1 | 3/2014 | Papagrigoriou et al. | |
| 2014/0084059 A1 | 3/2014 | Sierchio et al. | |
| 2014/0145513 A1 | 5/2014 | Kapoor et al. | |
| 2014/0158761 A1 | 6/2014 | Kim et al. | |
| 2014/0183269 A1 | 7/2014 | Glaser et al. | |
| 2014/0243618 A1 | 8/2014 | Charles, Jr. et al. | |
| 2014/0307192 A1 | 10/2014 | Stahl et al. | |
| 2014/0327320 A1* | 11/2014 | Muhs | A43B 7/02 |
| | | | 307/104 |
| 2014/0346236 A1 | 11/2014 | Kargl et al. | |
| 2015/0097038 A1 | 4/2015 | Narendra et al. | |
| 2015/0097039 A1 | 4/2015 | Narendra et al. | |
| 2015/0186766 A1 | 7/2015 | Mullen et al. | |
| 2015/0262052 A1 | 9/2015 | Pahuja et al. | |
| 2015/0356285 A1 | 12/2015 | Glaser et al. | |
| 2016/0020649 A1* | 1/2016 | Bell | H02J 50/80 |
| | | | 307/104 |
| 2016/0021107 A1* | 1/2016 | Lazzaro | G06K 19/0718 |
| | | | 726/9 |
| 2016/0072544 A1* | 3/2016 | Bosenko | H01Q 1/48 |
| | | | 455/78 |
| 2016/0098627 A1* | 4/2016 | Jain | G06Q 20/352 |
| | | | 235/492 |
| 2016/0148188 A1* | 5/2016 | Jain | G06K 19/07767 |
| | | | 705/64 |

(56) References Cited

U.S. PATENT DOCUMENTS

| | | |
|---|---|---|
| 2016/0180209 A1 | 6/2016 | Mullen et al. |
| 2016/0204660 A1* | 7/2016 | Faith .................. G06K 19/0705 |
| | | 235/492 |
| 2016/0226862 A1 | 8/2016 | Song et al. |
| 2016/0307082 A1 | 10/2016 | Wurmfeld et al. |
| 2017/0053253 A1 | 2/2017 | Glaser et al. |
| 2017/0064283 A1 | 3/2017 | Takahashi et al. |
| 2017/0109620 A1* | 4/2017 | Wurmfeld .............. G06K 19/02 |
| 2017/0147916 A1* | 5/2017 | Cox ....................... H05K 1/182 |
| 2017/0280127 A1 | 9/2017 | Takahashi et al. |
| 2017/0280128 A1 | 9/2017 | Takahashi et al. |
| 2017/0300796 A1 | 10/2017 | Mullen et al. |
| 2017/0372318 A1 | 12/2017 | Shami et al. |
| 2018/0044040 A1 | 2/2018 | Sullivan et al. |
| 2018/0095537 A1 | 4/2018 | Dillon, Jr. et al. |
| 2018/0108993 A1* | 4/2018 | Lim ........................ H02J 7/025 |
| 2019/0027976 A1* | 1/2019 | Koeppel ............... H04W 8/005 |
| 2019/0080127 A1* | 3/2019 | Yoshida ................. G06K 7/143 |
| 2019/0190568 A1* | 6/2019 | Koeppel .............. H04B 5/0037 |
| 2020/0005111 A1* | 1/2020 | Wurmfeld .......... G06Q 20/3552 |
| 2020/0005114 A1* | 1/2020 | Finn ................. G06K 19/07794 |
| 2020/0125914 A1* | 4/2020 | Wurmfeld ........ G06K 19/07707 |
| 2020/0177000 A1* | 6/2020 | Wurmfeld ............... H02J 50/10 |

OTHER PUBLICATIONS

Wikihow, "How to make a Solar Charging Phone Case," https://www.wikihow.com/Make-a-solar-Charging-Phone-Case, Jun. 5, 2013, 1 page.

Co-pending U.S. Appl. No. 15/850,686, entitled "Transaction Card for Transferring Solar Power", by Edwards, Joshua, filed Dec. 21, 2017, 34 pages.

* cited by examiner

TRANSACTION CARD FOR TRANSFERRING SOLAR POWER

RELATED APPLICATION

This application is a continuation of U.S. patent application Ser. No. 15/850,686, filed Dec. 21, 2017, which is incorporated herein by reference.

BACKGROUND

Transactions often involve use of a transaction card (e.g., a credit card, a debit card, a gift card, an automated teller machine (ATM) card, a rewards card or client loyalty card, or the like) to pay for products or services at a transaction terminal (e.g., point of sale (PoS) terminal) of an individual or business engaged in the sale of goods or services, e.g., via a swiping of the transaction card at a card reader, insertion of the transaction card into a chip reader, or wireless transmission of transaction card data to a wireless receiver. In some instances, a magnetic strip, integrated circuit chip, radio frequency (RF) antenna, and/or radio frequency identification (RFID) tag may be included in a transaction card to provide information associated with the transaction card (e.g., an account identifier, account information, a payment token, or the like).

SUMMARY

According to some implementations, a transaction card for communicating data relating to a transaction may comprise: a solar layer; a transaction card layer; and a power transfer layer; where the solar layer includes at least one solar panel capable of converting light into electricity; the transaction card layer supports the solar layer and includes a magnetic strip; and the power transfer layer includes circuitry capable of receiving electricity from the solar layer.

According to some implementations, a transaction card for communicating data relating to a transaction may comprise: a solar layer; a transaction card layer; and a power transfer layer; where the solar layer includes at least one solar panel capable of converting light into electricity; the transaction card layer includes: a housing portion for physically supporting the solar layer, and a component including account data; and the power transfer layer includes: a first component for receiving electricity from the solar layer, and a second component for providing electricity as output.

According to some implementations, a transaction card for communicating data relating to a transaction may comprise: a solar panel capable of converting light into electricity; a magnetic strip including account data; a first electrical component capable of receiving electricity from the solar panel; and a second electrical component capable of providing electricity as output; where dimensions of the transaction card are substantially: 85.6 millimeters long, 53.98 millimeters wide, and 0.76 millimeters thick.

DETAILED DESCRIPTION

The following detailed description of example implementations refers to the accompanying drawings. The same reference numbers in different drawings may identify the same or similar elements.

Individuals often carry transaction cards to enable the individuals to conduct transactions using the transaction cards, e.g., by using the transaction cards to purchase goods or services at retail stores, from online shopping websites, from other individuals, or the like. While transaction cards may be useful when being used to conduct transactions, transaction cards may not have any other use outside of the transaction context. Accordingly, individuals often carry transaction cards for extended periods of time while only making use of the transaction cards when conducting a transaction.

Some implementations, described herein, provide a transaction card for transferring solar power to one or more other devices. For example, a transaction card may include a solar layer for generating electricity from sunlight using solar cells. The transaction card may also include a power transfer layer for obtaining the electricity from the solar layer and allowing the electricity to be transferred to an electronic device (e.g., wirelessly via inductive charging and/or using physical contacts). The transaction card may also include a transaction card layer that is capable of providing support for the other layers and/or providing transaction data to a transaction terminal (e.g., to enable the transaction card to be used for making purchases of goods or services).

By including a solar layer and power transfer layer in a transaction card, the transaction card may be capable of charging electronic devices, e.g., when not in use for conducting a transaction. The ability to use a transaction card to charge an electronic device may obviate the need for an individual to carry other devices for charging the electronic device. The use of solar power creates a readily accessible and renewable source of power. In some implementations, the power transfer layer may include components to enable wireless charging of devices capable of wireless charging, such as cellular phones. In some implementations, the power transfer layer may include a battery to enable storage of electricity to be used for charging at a later time. The transaction card may also be used as a transaction card (e.g., capable of being used for purchasing goods and services), providing an individual with a useful multi-purpose device in a form factor that is easily portable.

Figure 1A:
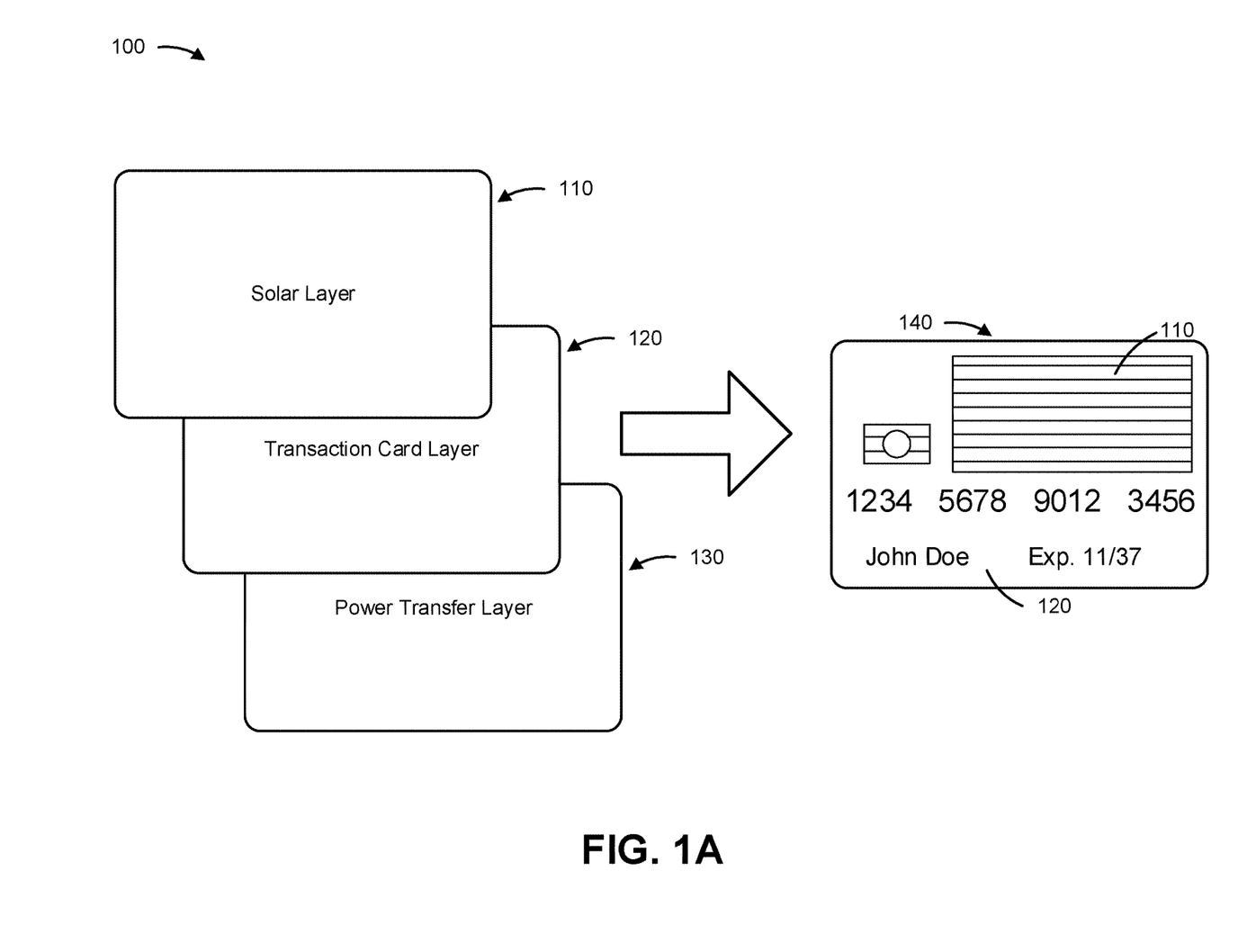
FIGS. 1A-1B are diagrams of overviews of an example implementation of a transaction card described herein.
Figure 1B:
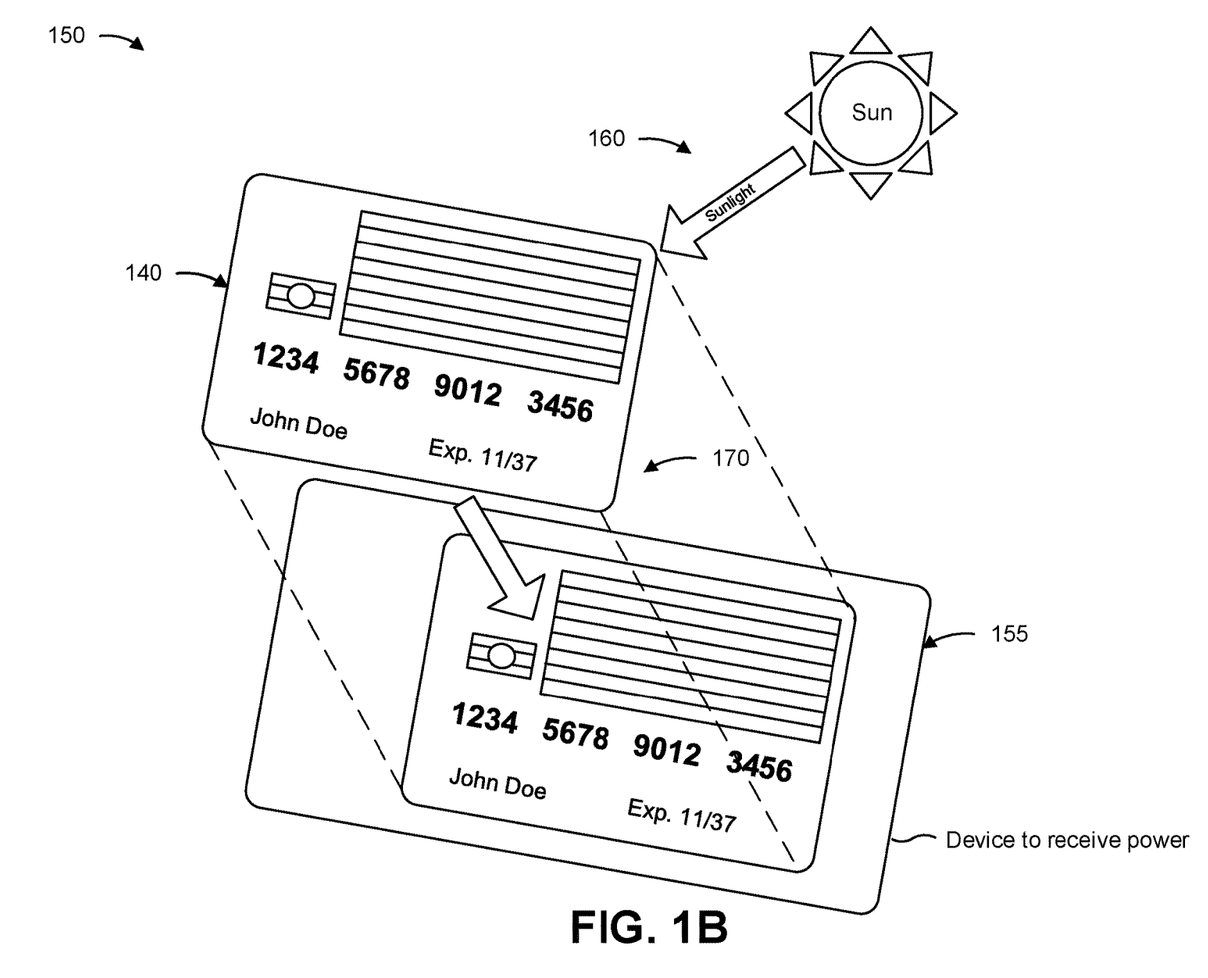

FIGS. 1A-1B are diagrams of overviews 100 and 150 of an example implementation of a transaction card described herein. As shown in FIG. 1A, the overview 100 of the example implementation may include a solar layer 110, a transaction card layer 120, and a power transfer layer 130. The three example layers are also depicted as combined into an example transaction card 140.

As shown in FIG. 1A, the example transaction card 140 includes a solar layer 110. The solar layer 110 includes one or more components designed to generate and supply solar electricity. For example, the solar layer may include one or more solar panels. A solar panel may include a variety of components, such as a cover (e.g., constructed from transparent or semi-transparent glass, plexiglass, polycarbonate, or the like), one or more encapsulant layers (e.g., constructed from ethylene vinyl acetate (EVA), clear silicone, or the like), one or more solar cells (e.g., a photovoltaic cell that may be constructed from a variety of materials, including crystalline silicon, amorphous silicon (a-Si), cadmium telluride (CdTe), or the like), and a backsheet (e.g., constructed from polyvinyl fluoride (PVF), polyethylene terephthalate (PET), or the like). In some implementations, the solar layer 110 may include other components, whether the other components relate to the generation of electricity from light or whether the components relate to other functionality, such as transferring or storing electricity.

As further shown in FIG. 1A, the example transaction card 140 includes a transaction card layer 120. The transaction card layer 120 includes one or more components designed to enable the transaction card to be used to conduct a transaction (e.g., to purchase goods and services). For example, the transaction card layer 120 may include a magnetic strip, integrated circuit chip, RF antenna, and/or RFID tag to provide information associated with the transaction card 140 (e.g., an account identifier, account information, a payment token, or the like). In some implementations, the transaction card layer 120 may include other components, such as components designed to physically support components of one or more other layers, such as solar layer 110 and power transfer layer 130.

As further shown in FIG. 1A, the example transaction card 140 includes a power transfer layer 130. The power transfer layer 130 includes one or more components designed to receive electricity from the solar layer 110 and provide electricity as output. For example, the power transfer layer 130 may include a battery (e.g., a thin or ultra-thin lithium polymer rechargeable battery, a thin-film lithium-ion battery, or the like), one or more electrical contacts (e.g., electrically conductive material capable of transferring electricity through contact, such as copper, gold, silver, or the like), a wireless power transfer component (e.g., an inductive coil or antenna, such as a near-field communications (NFC) antenna, capable of generating an alternating electromagnetic field for creating inductive coupling with an electronic device to form an air transformer), and/or circuitry on a printed circuit board (PCB) including various components for managing the transfer of electricity from the solar layer 110 to an electronic device (e.g., via the one or more electrical contacts or the wireless power transfer component). In some implementations, the power transfer layer 130 may include other components, whether the other components relate to the transfer of electricity or whether the components relate to other functionality.

As further shown in FIG. 1A, transaction card 140 may include other components, such as a logo identifying an organization associated with the transaction card 140, lettering identifying a user associated with the transaction card 140, numbers indicating an account number and expiration date, a signature strip for a signature of the user associated with the transaction card 140, or the like.

While example components in overview 100 of FIG. 1A are depicted and described as being included in three separate layers (e.g., solar layer 110, transaction card layer 120, and power transfer layer 130), the distinction between layers may, in some implementations, be logical, rather than actual dedicated layers for each of the functions described above. For example, various components described with respect to the solar layer 110 may be included in, or include, components described as being included in the transaction card layer 120 and/or power transfer layer 130. Similarly, various components described with respect to the transaction card layer 120 may be included in, or include, components described as being included in the solar layer 110 and/or power transfer layer 130. Likewise, various components described with respect to the power transfer layer 130 may be included in, or include, components described as being included in the solar layer 110 and/or transaction card layer 120. In addition, the sizes of the layers, while depicted as each being the same size, may vary. By way of example, the example transaction card 140 includes a smaller solar layer 110 embedded in a transaction card layer 120 that is larger than the solar layer 110. Other configurations and layouts are also possible.

As shown in FIG. 1B, the overview 150 of the example implementation depicts the transaction card 140 and an electronic device 155 (e.g., the device to receive power from transaction card 140, such as a cell phone, tablet computer, laptop computer, video game device, battery pack, wearable device, or any other type of device capable of receiving an electrical charge). As shown in FIG. 1B, and by reference number 160, the transaction card 140 receives sunlight by having the solar panels included in the transaction card 140 exposed to the sun. The solar panels included in the solar layer 110 of the transaction card 140 convert the sunlight into electricity, which can be stored by components included in the solar layer 110 and/or the power transfer layer 130 of the transaction card 140. While the example depicted in FIG. 1B includes the sun as the source of light, in some situations, other light sources may also enable solar panels to convert light into electricity (e.g., incandescent light bulbs, fluorescent light bulbs, or the like).

As further shown in FIG. 1B, and by reference number 170, the transaction card 140 is placed on or near the electronic device 155. By placing the transaction card 140 on or near the electronic device 155, power may be transferred from the power transfer layer 130 of the transaction card 140 to the electronic device 155. For example, in a situation where the power transfer layer 130 and the electronic device 155 include inductive charging components, placing the transaction card 140 on or near the electronic device 155 may create an inductive coupling, causing power to be transferred from the inductive components included in the transaction card 140 to the inductive components included in the electronic device 155. As another example, transaction card 140 may include electrical contacts (e.g., metal contacts included in the power transfer layer 130 of the transaction card 140) that make contact with corresponding electrical contacts of the electronic device 155 to enable the transfer of power from the transaction card 140 to the electronic device 155. While the example depicted in FIG. 1B shows the electronic device 155 in contact or proximity to the transaction card 140 to receive power, in some implementations, an intermediate component may be used to transfer power from the transaction card 140 to the electronic device 155, such as a cable connected to the electronic device 155, a case with contacts and/or inductive components connected to the electronic device 155, or the like.

Accordingly, by including a solar layer 110 and power transfer layer 130 in a transaction card 140, the transaction card 140 may be capable of charging electronic devices, e.g., when not in use for conducting a transaction. As noted above, the ability to use a transaction card 140 to charge an electronic device may obviate the need for an individual to carry another device for charging the electronic device. The use of solar power creates a readily accessible and renewable source of power. The transaction card 140 may also be used to conduct transactions (e.g., capable of being used for purchasing goods and services), providing an individual with a useful multi-purpose device in a form factor that is easily portable.

As indicated above, FIGS. 1A-1B are provided merely as examples. Other examples are possible and may differ from what was described with regard to FIGS. 1A-1B.

Figure 2:
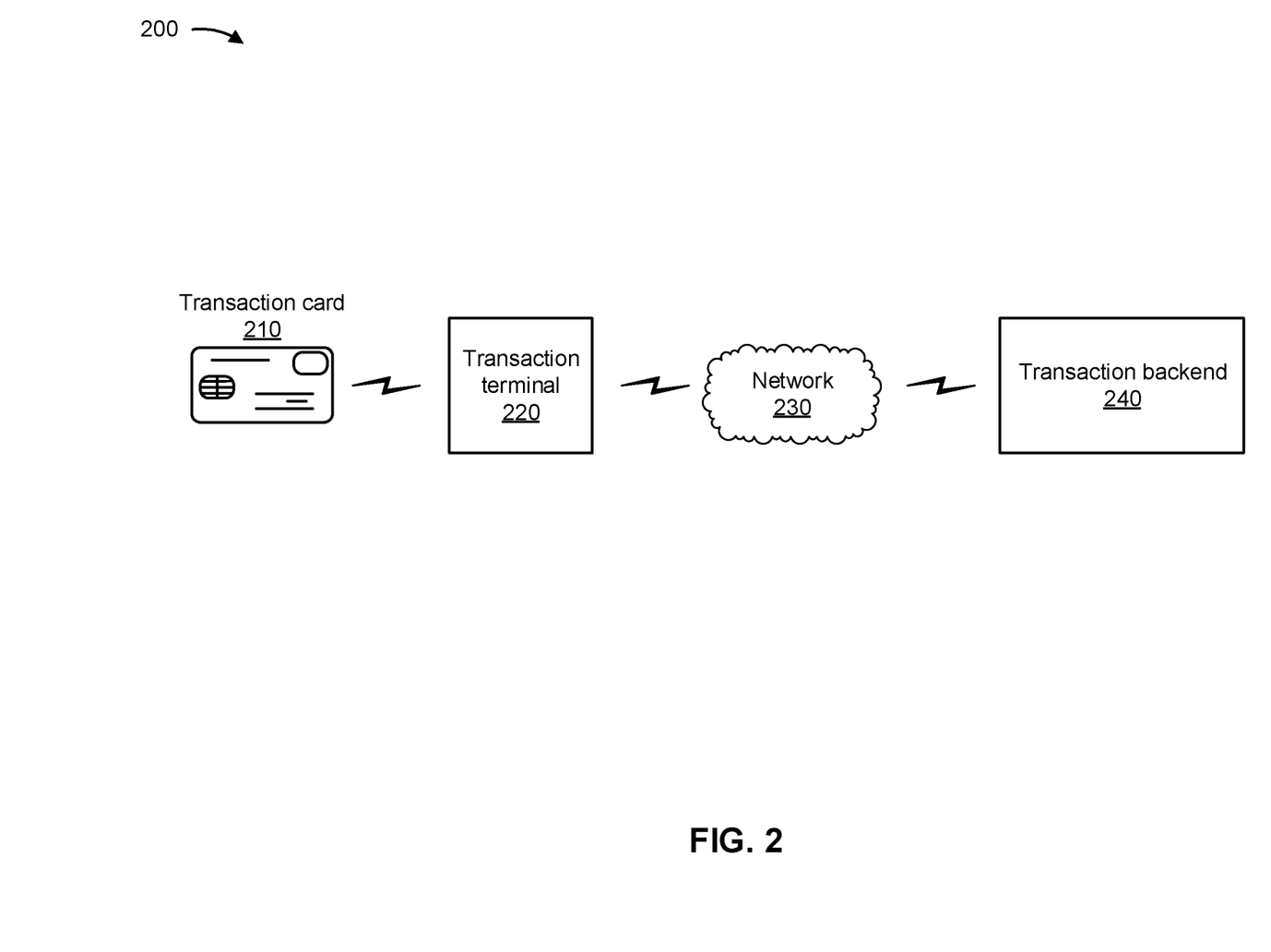
FIG. 2 is a diagram of an example environment in which a transaction card described herein, may be used.

FIG. 2 is a diagram of an example environment 200 in which a transaction card described herein, may be used. As shown in FIG. 2, environment 200 may include a transaction card 210, a transaction terminal 220, a network 230, and a transaction backend 240. In environment 200, transaction card 210 may communicate data associated with or relating to a transaction with transaction terminal 220, which facilitates processing the transaction through communication with transaction backend 240 via network 230. Devices of environment 200 may interconnect via wired connections, wireless connections, or a combination of wired and wireless connections.

Transaction card 210 includes a transaction card (such as transaction card 140) with solar components (e.g., solar layer 110), transaction card components (e.g., transaction card layer 120), and power transfer components (e.g., power transfer layer 130). Transaction card 210 is capable of storing and/or communicating data for a point of sale (PoS) transaction with transaction terminal 220. For example, transaction card 210 may store or communicate data including account information (e.g., an account identifier, a cardholder identifier, etc.), expiration information of transaction card 210, banking information, transaction information (e.g., a payment token), or the like. For example, to store or communicate the data, transaction card 210 may include a magnetic strip and/or an integrated circuit (IC) chip (e.g., a EUROPAY®, MASTERCARD®, VISA® (EMV) chip, or the like).

In some implementations transaction card 210 may store or communicate the above data using transaction card components, such as those that may be included in transaction card layer 120. As described above, in some implementations, transaction card 210 may also include other components (e.g., in solar layer 110 and power transfer layer 130) to enable the transfer of power from light contacting the transaction card 210 to another electronic device capable of receiving power (e.g., electronic device 155). In some implementations, the dimensions of transaction card 210 are substantially: 85.6 millimeters long, 53.98 millimeters wide, and 0.76 millimeters thick, or otherwise in conformance with International Organization for Standardization/International Electrotechnical Commission (ISO/IEC) standards.

In some implementations, transaction card 210 may include an antenna to communicate data associated with transaction card 210. The antenna may be a passive radio frequency (RF) antenna, an active RF antenna, and/or a battery-assisted RF antenna. In some implementations, transaction card 210 may be a smart transaction card, capable of communicating wirelessly (e.g., via Bluetooth, Bluetooth Low Energy (BLE), near-field communication (NFC), or the like) with a computing device, such as transaction terminal 220, a digital wallet, a user device (e.g., a cellular phone, a smart phone, a tablet computer, a wearable device, etc.), and/or another device. In some implementations, transaction card 210 may communicate with transaction terminal 220 to complete a transaction (e.g., based on being moved within communicative proximity of transaction terminal 220).

Transaction terminal 220 includes one or more devices capable of receiving, generating, storing, processing, and/or providing information associated with facilitating a transaction (such as a PoS transaction). For example, transaction terminal 220 may include a communication device and/or computing device capable of receiving data from transaction card 210 and/or processing a transaction based on the data. In some implementations, transaction terminal 220 may include a desktop computer, a laptop computer, a tablet computer, a handheld computer, and/or a mobile phone (e.g., a smart phone, a radiotelephone, etc.). Transaction terminal 220 may be owned and/or operated by one or more individuals or businesses engaged in a sale of goods or services (e.g., one or more merchants, vendors, service providers, or the like).

Transaction terminal 220 may include one or more devices to facilitate processing a transaction via transaction card 210. Transaction terminal 220 may include a PoS terminal, a security access terminal, an ATM terminal, or the like. Transaction terminal 220 may include one or more input devices and/or output devices to facilitate obtaining transaction card data from transaction card 210 and/or interaction or authorization from a cardholder of transaction card 210. Example input devices of transaction terminal 220 may include a number keypad, a touchscreen, a magnetic strip reader, a chip reader, and/or an RF signal reader. A magnetic strip reader of transaction terminal 220 may receive transaction card data as a magnetic strip of transaction card 210 is swiped along the magnetic strip reader. A chip reader of transaction terminal 220 may receive transaction card data from an IC chip (e.g., an EMV chip) of transaction card 210 when the chip is placed in contact with the chip reader. An RF signal reader of transaction terminal 220 may enable contactless transactions from transaction card 210 by obtaining transaction card data wirelessly from transaction card 210 as transaction card 210 comes within a range of transaction terminal 220 that the RF signal reader may detect an RF signal from an RF antenna of transaction card 210. Example output devices of transaction terminal 220 may include a display device, a speaker, a printer, or the like.

Network 230 includes one or more wired and/or wireless networks. For example, network 230 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

Transaction backend 240 includes one or more devices capable of authorizing and/or facilitating a transaction. For example, transaction backend 240 may include one or more servers and/or computers to store and/or provide information (e.g., authorizations, balances, payment tokens, security information, account information, or the like) associated with processing a transaction via transaction terminal 220.

Transaction backend 240 may include one or more devices associated with banks and/or transaction card associations that authorize the transaction and/or facilitate a transfer of funds or payments between an account of a cardholder of transaction card 210 and an account of an individual or business of transaction terminal 220. For example, transaction backend 240 may include one or more devices of one or more issuing banks associated with a cardholder of transaction card 210, one or more devices of one or more acquiring banks (or merchant banks) associated with transaction terminal 220, and/or one or more devices associated with one or more card associations (e.g., VISA®, MASTERCARD®, or the like) associated with transaction card 210. Accordingly, in response to receiving transaction card data associated with transaction card 210 from transaction terminal 220, various banking institutions and/or card associations of transaction backend 240 may communicate to authorize the transaction and/or transfer funds between the accounts associated with transaction card 210 and/or transaction terminal 220.

Transaction backend 240 may include one or more devices associated with security that may provide or deny authorization associated with the transaction. For example, transaction backend 240 may store and/or provide security access information that may or may not allow access through an access point (e.g., a gate, a door, or the like) of a secure location (e.g., a room, a building, a geographical area, a transportation terminal, or the like) based on information (e.g., account information, a key, an identifier, credentials, or the like) associated with transaction card 210 and/or provided by transaction terminal 220.

Transaction backend 240 may include one or more devices associated with a rewards program with transaction card 210 and/or an entity (e.g., a bank, a merchant, a service provider, a vendor, or the like) associated with the transaction card 210 and/or transaction terminal 220. For example, transaction backend 240 may authorize the earning and/or redemption of rewards (e.g., rewards points associated with transaction card 210, cash rewards, client loyalty rewards associated with an entity associated with transaction terminal 220, or the like) based on a transaction processed by transaction terminal 220 with transaction card 210.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
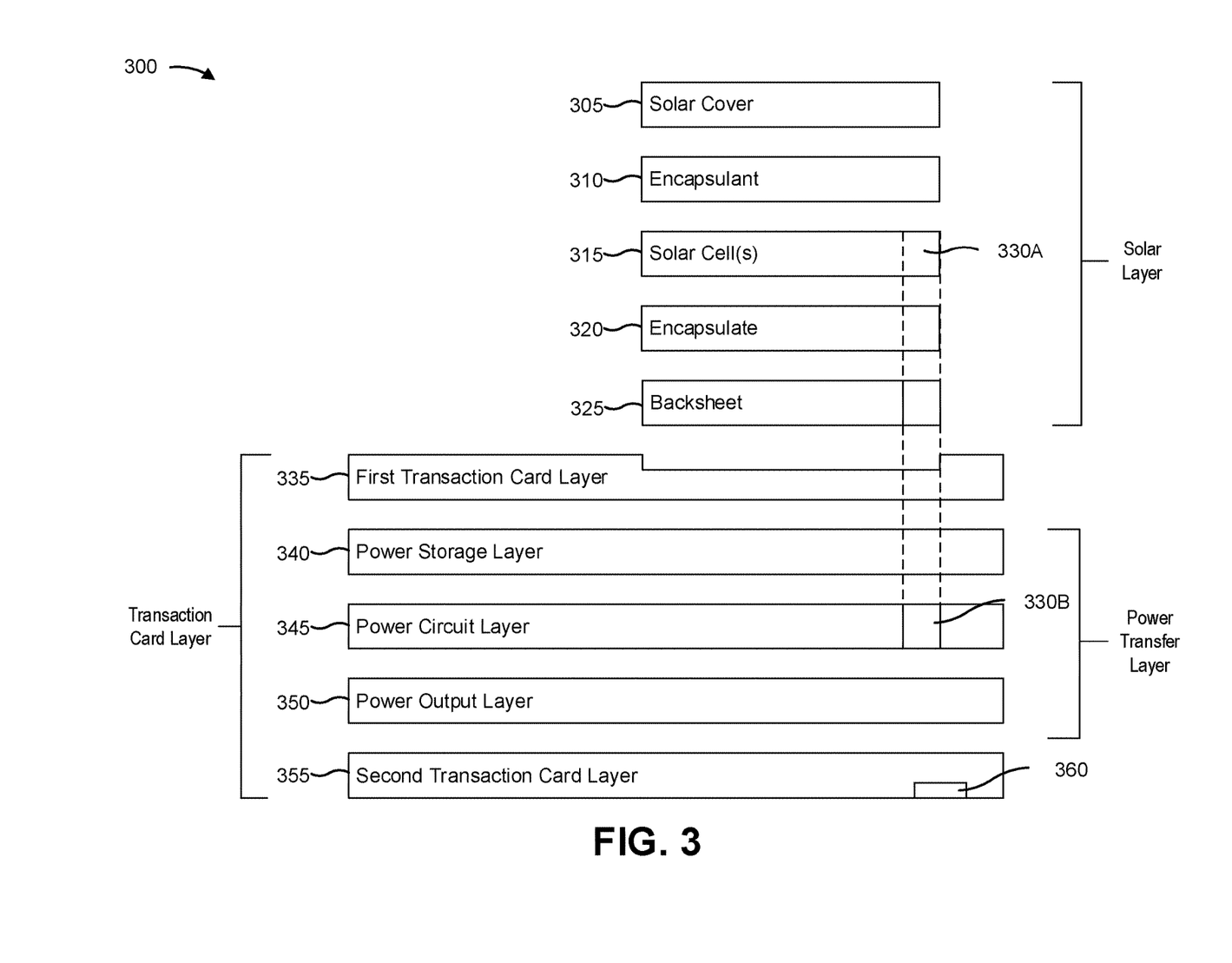
FIG. 3 is a diagram of example components of an example implementation of a transaction card.

FIG. 3 is a diagram of example components of an example implementation 300 of a transaction card 210. As shown in FIG. 3, implementation 300 may include solar cover 305, encapsulant 310, solar cell(s) 315, encapsulate 320, backsheet 325, wiring 330A and 330B, first transaction card layer 335, power storage layer 340, power circuit layer 345, power output layer 350, second transaction card layer 355, and magnetic strip 360. FIG. 3 also indicates which components may, in the example implementation 300, be included in each of the three logical layers (e.g., solar layer, such as solar layer 110, transaction card layer, such as transaction card layer 120, and power transfer layer, such as power transfer layer 130). Components of implementation 300 may be constructed and/or connected in a variety of ways, including soldering metallic components, laminating components together, or the like.

The example solar layer includes solar cover 305, encapsulants 310 and 320, solar cell(s) 315, and backsheet 325. Solar cover 305 may include, for example, a sheet of transparent or semi-transparent glass, plexiglass, polycarbonate, or the like, for protecting solar cell(s) 315 while still enabling light to penetrate to solar cell(s) 315. Encapsulants 310 and 320 may include, for example, a layer of EVA, clear silicone, or the like, for protecting and insulating solar cell(s) 315 (e.g., from moisture, heat, or the like). Solar cell(s) 315 may include one or more photovoltaic cells for converting light into electricity, which may be of a variety of types of solar cells, such as crystalline silicon cells, a-Si cells, CdTe cells, or the like. Solar cell(s) 315 are also depicted as being connected to power circuit layer 345 via wiring 330A connected to solar cell(s) 315 on one end and wiring 330B connected to power circuit layer 345 on the other end. Backsheet 325 may include a layer of material for physically supporting and protecting solar cell(s) 315, which may include a layer constructed of PVF, PET, or the like.

The example transaction card layer includes first transaction card layer 335, second transaction card layer 355, and magnetic strip 360. The example transaction card layer also encompasses the example power transfer layer (e.g., enclosing and/or physically supporting the components of the power transfer layer). First transaction card layer 335 may be made of a variety of materials, including polymer-based materials, metallic material, wood material, or the like. For example, first transaction card layer 335 may be constructed of polyvinyl chloride acetate (PVCA). First transaction card layer 335 may include a variety of transaction card 210 features, including text (e.g., embossed or printed account numbers, cardholder name, expiration date, or the like), a hologram or other card association mark, an IC chip, or the like. In some implementations, as shown in the example first transaction card layer 335, first transaction card layer 335 may define a notch or other feature for receiving, housing, connecting to, and/or supporting components of other layers, such as a hole or notches for receiving components of a solar layer and/or power transfer layer. Similar to the first transaction card layer 335, the second transaction card layer 355 may also be constructed of a variety of materials, which may be the same as or different from the materials used to construct the first transaction card layer 335. Second transaction card layer 355 may also include a variety of transaction card 210 features, including text, a signature strip, a magnetic strip 360 (e.g., comprised of magnetic tape, magnetic ink, or the like, to provide information associated with the transaction card 210 to a magnetic card reader), and/or other transaction card 210 features. While the example transaction card layer includes magnetic strip 360, in some implementations a transaction card 210 may not include magnetic strip 360, and may use another component (such as an IC chip) for providing information associated with the transaction card 210.

The example power transfer layer includes power storage layer 340, power circuit layer 345, and power output layer 350. Components of the example power transfer layer may, in some implementations, be included in or enclosed by materials comprising the transaction card layer (e.g., the power transfer layer may be encased in a polymer-based material that includes the first transaction card layer 335 and second transaction card layer 355). Power storage layer 340 may include one or more components for storing power, such as a thin or ultra-thin lithium polymer rechargeable battery, a thin-film lithium-ion battery, a thin capacitor, or the like. Power circuit layer 345 may include circuitry, including a printed circuit board (PCB) including components for receiving power from solar cell(s) 315 (e.g., wiring, such as wiring 330A and 330B) and components for providing power to power output layer 350 (e.g., additional wiring, an oscillator for producing a resonant frequency, a power transistor, a full wave rectifier for converting alternating current to direct current, a voltage regulator, an integrated circuit for managing battery charging, or the like). Power output layer 350 may include a variety of components for providing power, as output, to an electronic device. For example, power output layer 350 may include conductive output contacts for physically and electrically connecting with contacts of an electronic device and/or wireless power transfer components (e.g., inductive coil or antenna).

The depicted implementation 300 is intended to provide a logical representation of potential components of transaction card 210, rather than a physically proportional representation. The number and arrangement of components shown in FIG. 3 are provided as an example. In practice, there may be additional components, fewer components, different components, or differently arranged components than those shown in FIG. 3. Furthermore, two or more components shown in FIG. 3 may be implemented within a single component, or a single component shown in FIG. 3 may be implemented as multiple, separate components. Additionally, or alternatively, a set of components (e.g., one or more components) of implementation 300 may provide the functionality described as being provided by another set of components of implementation 300.

Figure 4A:
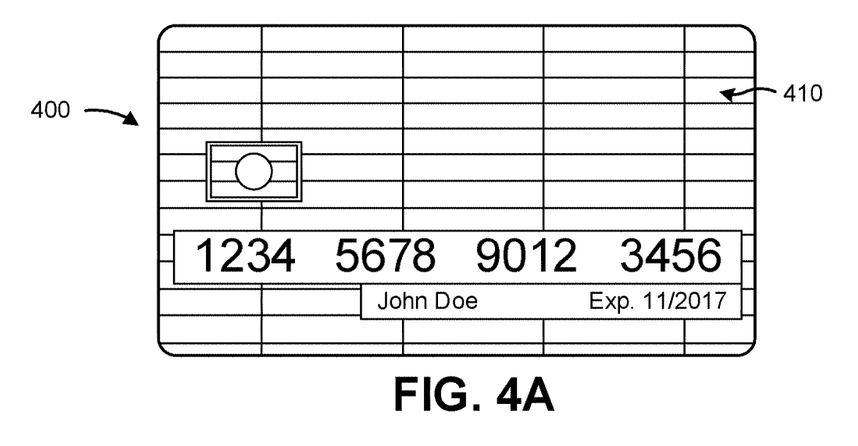
FIGS. 4A-4B are diagrams of example implementations of a solar layer of a transaction card described herein.

FIGS. 4A-4B are diagrams of example implementations 400 and 450 of a solar layer of a transaction card 210 described herein. As shown in FIG. 4A, example implementation 400 depicts a first side of a transaction card 210. In this example, the solar layer 410, including one or more solar cells, covers almost the entire first side of the transaction card 210. Other features of the first side of the transaction card 210, such as an IC chip, account number, name, and expiration date, are depicted as being printed on top of and/or cut out from the solar layer 410.

Figure 4B:
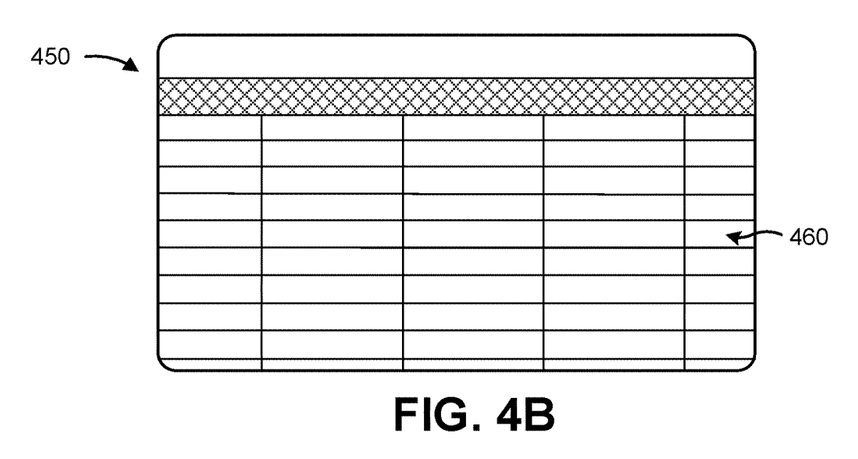

As shown in FIG. 4B, example implementation 450 depicts a second side of a transaction card 210. In this example, the solar layer 460, including one or more solar cells, covers the portion of the second side of the transaction card 210 that is below the magnetic strip.

In some implementations, the transaction card 210 may include solar layer 410 and not solar layer 460. In some implementations, the transaction card 210 may include solar layer 460 and not solar layer 410. In some implementations, the transaction card 210 may include both solar layer 410 and solar layer 460.

The arrangements of the solar layers, and the number and arrangement of other features shown in FIGS. 4A and 4B are provided as examples. In practice, there may be additional features, fewer features, different features, a differently arranged solar layer, or differently arranged features than those shown in FIGS. 4A and 4B.

Figure 5A:
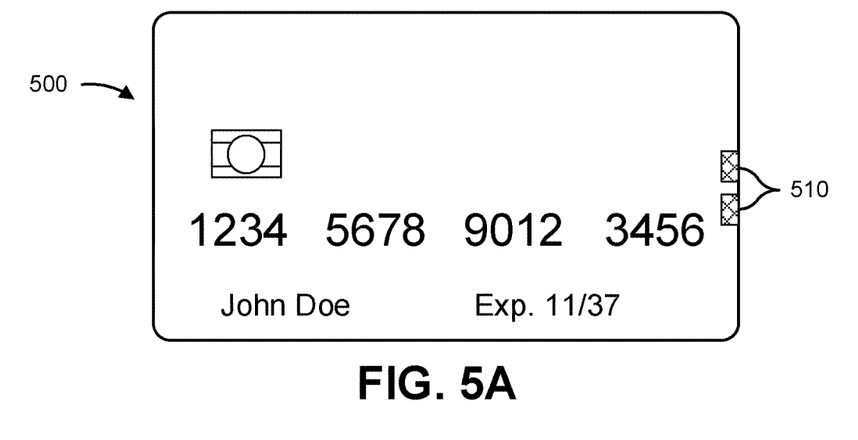
FIGS. 5A-5B are diagrams of example implementations of power transfer components of a transaction card described herein.

FIGS. 5A-5B are diagrams of example implementations 500 and 550 of power transfer components of a transaction card 210 described herein. As shown in FIG. 5A, example implementation 500 depicts a first side of a transaction card 210. In this example, the power transfer components include conductive contacts 510 on the first side of the transaction card 210. The conductive contacts 510 may be arranged to physical and electrically connect with conductive contacts of an electronic device (e.g., to transfer power from transaction card 210 to the electronic device).

Figure 5B:
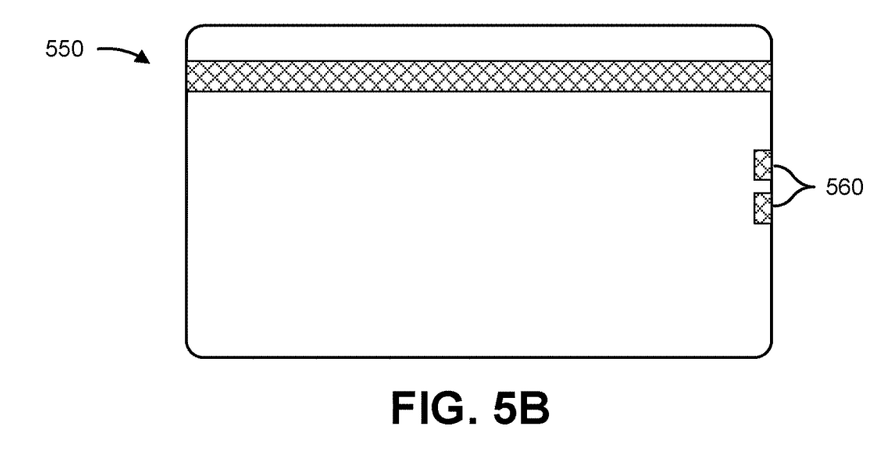

As shown in FIG. 5B, example implementation 550 depicts a second side of a transaction card 210. In this example, the power transfer components include conductive contacts 560 that provide functionality similar to that of the conductive contacts 510 of FIG. 5A (e.g., to transfer power from transaction card 210 to an electronic device).

In some implementations, the transaction card 210 may include conductive contacts 510 and not conductive contacts 560. In some implementations, the transaction card 210 may include conductive contacts 560 and not conductive contacts 510. In some implementations, the transaction card 210 may include both conductive contacts 510 and conductive contacts 560.

The arrangements of the conductive contacts, and the number and arrangement of other features shown in FIGS. 5A and 5B are provided as examples. In practice, there may be additional features, fewer features, different features, differently arranged conductive contacts, or differently arranged features than those shown in FIGS. 5A and 5B.

Figure 6A:
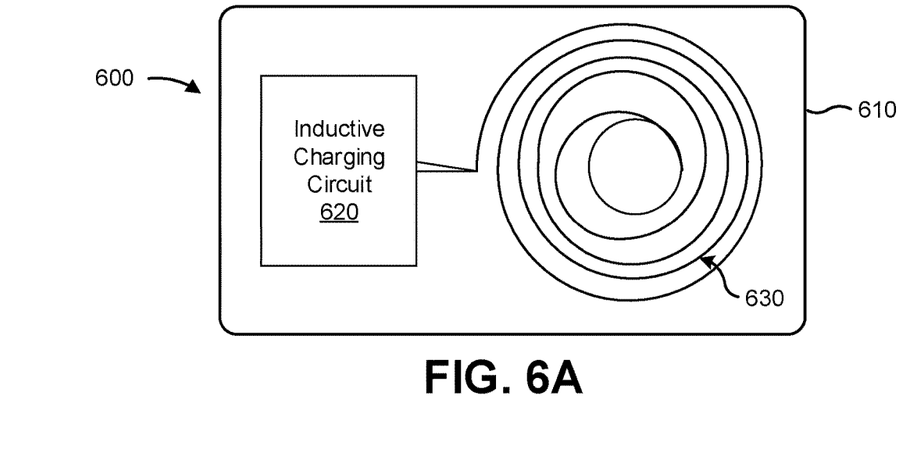
FIGS. 6A-6B are diagrams of example implementations of a power transfer layer of a transaction card described herein.

FIGS. 6A-6B are diagrams of example implementations 600 and 650 of a power transfer layer of a transaction card 210 described herein. As shown in FIG. 6A, example implementation 600 depicts a power transfer layer 610 that includes an inductive charging circuit 620 and an inductive coil 630. As described above with reference to FIG. 3, the inductive charging circuit 620 may receive power from wiring connected to one or more solar cells and convert the power into current running through the inductive coil 630. The current running through the inductive coil 630 is designed to enable the power transfer layer 610 to form an inductive coupling with another inductive coil of an electronic device, e.g., to enable the transfer of power from the transaction card 210 to the electronic device.

Figure 6B:
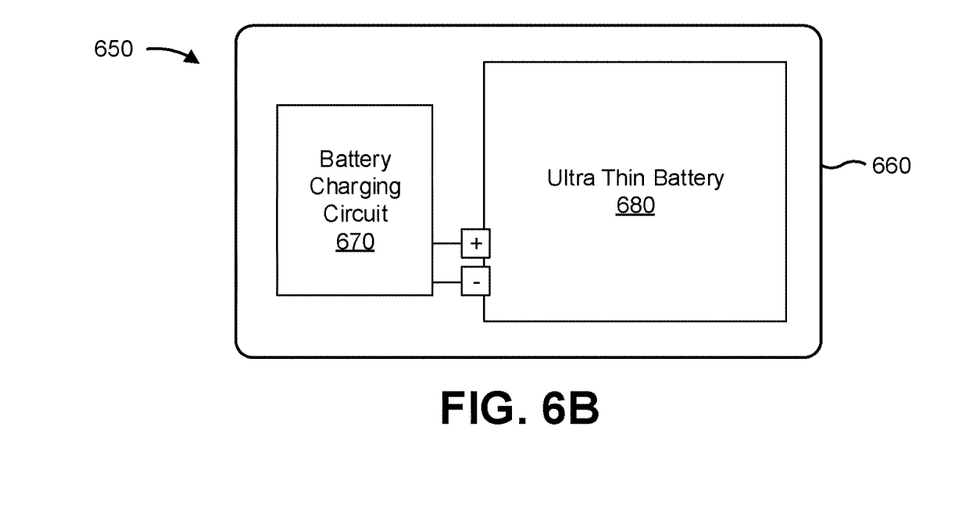

As shown in FIG. 6B, example implementation 650 depicts a power transfer layer 660 that includes a battery charging circuit 670 and an ultra-thin battery 680. As described above with reference to FIG. 3, the battery charging circuit 670 may regulate power received from wiring connected to one or more solar cells to charge the ultra-thin battery 680 and also regulate power output, e.g., through conductive contacts and/or a wireless power transfer component, such as an inductive coil. The combination of battery charging circuit 670 and ultra-thin battery 680 may be used for contact-based and/or contactless charging of an electronic device.

In some implementations, the transaction card 210 may include power transfer layer 610 and not power transfer layer 660. In some implementations, the transaction card 210 may include power transfer layer 660 and not power transfer layer 610. In some implementations, the transaction card 210 may include both power transfer layer 610 and power transfer layer 660.

The number and arrangement of components shown in FIGS. 6A and 6B are provided as examples. In practice, there may be additional components, fewer components, different components, or differently arranged components than those shown in the example power transfer layers depicted in FIGS. 6A and 6B.

As indicated above, FIGS. 4A, 4B, 5A, 5B, 6A, and 6B are provided merely as examples. Other examples are possible and may differ from what was described with regard to FIGS. 4A, 4B, 5A, 5B, 6A, and 6B.

As noted above, by including a solar layer and power transfer layer in a transaction card 210, the transaction card 210 may be capable of charging electronic devices, e.g., when not in use for conducting a transaction. The ability to use a transaction card 210 to charge an electronic device may obviate the need for an individual to carry a device for charging the electronic device. The use of solar power creates a readily accessible and renewable source of power. In some implementations, the power transfer layer may include components to enable wireless charging of devices capable of wireless charging, such as cellular phones. In some implementations, the power transfer layer may include a battery to enable storage of electricity to be used for charging at a later time. The transaction card 210 may also be used to conduct transactions (e.g., capable of being used for purchasing goods and services), providing an individual with a useful multi-purpose device in a form factor that is easily portable.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. As used herein, the term "or the like" is intended to be inclusive (e.g., as in "and/or the like"), unless explicitly stated otherwise. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A transaction card, comprising:
    a solar layer,
        where the solar layer includes another first storage component for storing electricity;
    a transaction card layer; and
    a power transfer layer;
        where:
            the solar layer includes at least one solar panel capable of converting light into electricity;
            the transaction card layer includes a magnetic strip; and
            the power transfer layer includes:
                a second storage component for storing electricity,
                a power circuit layer to receive electricity from the solar layer, and
                a power output layer to charge a battery or battery pack of an external device via:
                    an inductive coil configured to enable the transaction card to charge the battery or the battery pack of the external device based on the transaction card being placed on the external device, or
                    electrical contacts configured to make contact with corresponding electrical contacts of the external device to enable transfer of power from the transaction card to the external device.

2. The transaction card of claim 1, where the second storage component includes:
    a battery.

3. The transaction card of claim 1, further comprising:
    a radio frequency (RF) antenna.

4. The transaction card of claim 1, further comprising:
    a wireless communication component.

5. The transaction card of claim 1, where the solar layer includes:
    a solar cover,
    an encapsulant,
    at least one solar cell, and
    a backsheet.

6. The transaction card of claim 1, where the solar layer further comprises:
    a solar cover comprising:
        a transparent glass,
        a semi-transparent glass,
        a plexiglass, or
        a polycarbonate.

7. The transaction card of claim 1, where the solar layer further comprises:
    an encapsulant comprising:
        ethylene vinyl acetate (EVA), or
        silicone.

8. A transaction card, comprising:
    a solar layer, where the solar layer includes a first storage component for storing electricity;
    a transaction card layer; and
    a power transfer layer;
        where:
            the solar layer includes at least one solar panel capable of converting light into electricity;
            the transaction card layer includes a magnetic strip; and
            the power transfer layer includes:
                a second storage component for storing electricity,
                a power circuit layer to receive electricity from the solar layer, and
                a power output layer to wirelessly charge a battery or battery pack of an external device via:
                    an inductive coil configured to enable the transaction card to charge the battery or the battery pack of the external device based on the transaction card being placed on the external device, and
            electrical contacts configured to make contact with corresponding electrical contacts of the external device to enable transfer of power from the transaction card to the external device.

9. The transaction card of claim 8, where the power transfer layer further includes:
    a near-field communication (NFC) antenna.

10. The transaction card of claim 8, where the transaction card layer encompasses the power transfer layer.

11. The transaction card of claim 8, where the solar layer is a first solar layer on a first side of the transaction card, and where the transaction card further comprises:
    a second solar layer on a second side of the transaction card.

12. The transaction card of claim 8, further comprising:
    conductive contacts on a first side of the transaction card.

13. The transaction card of claim 12, further comprising:
    first conductive contacts on a first side of the transaction card, and
    second conductive contacts on a second side of the transaction card.

14. A transaction card, comprising:
a first solar layer on a first external side of the transaction card,
the first solar layer including at least one solar panel capable of converting light into electricity, and the first solar layer including a first storage component for storing electricity;
a second solar layer on a second external side of the transaction card, the second solar layer including at least one other solar panel capable of converting light into electricity; and
a power transfer layer including:
a second storage component for storing electricity,
a power circuit layer to receive electricity from at least one of:
the first solar layer, or
the second solar layer, and
a power output layer to inductively charge a battery or battery pack of an external device via:
an inductive coil configured to enable the transaction card to charge the battery or the battery pack of the external device based on the transaction card being placed on the external device.

15. The transaction card of claim 14, where the second storage component includes:
a battery charging circuit, and
an ultra-thin battery.

16. The transaction card of claim 14, further comprising:
a transaction card layer comprising a magnetic strip.

17. The transaction card of claim 14, where the power transfer layer further includes:
conductive contacts for connecting with contacts of an electronic device.

18. The transaction card of claim 14, where the first solar layer further comprises:
a first solar cover comprising:
a transparent glass,
a semi-transparent glass,
a plexiglass, or
a polycarbonate; and
an encapsulant comprising:
ethylene vinyl acetate (EVA), or
silicone.

19. The transaction card of claim 14, where the second storage component comprises an ultra-thin battery.

* * * * *

UNITED STATES PATENT AND TRADEMARK OFFICE
CERTIFICATE OF CORRECTION

PATENT NO. : 10,930,801 B2
APPLICATION NO. : 16/289319
DATED : February 23, 2021
INVENTOR(S) : Joshua Edwards et al.

It is certified that error appears in the above-identified patent and that said Letters Patent is hereby corrected as shown below:

In the Claims

In Claim 1, Column 11, Line 44, "where the solar layer includes another first storage" should be changed to -- where the solar layer includes a first storage --.

In Claim 2, Column 12, Line 3, "a battery" should be changed to -- another battery --.

In Claim 8, Column 12, Line 40, "a power output layer to wirelessly charge a battery" should be changed to -- a power output layer to charge a battery --.

In Claim 12, Column 12, Line 61, "The transaction card of claim 8, further comprising: conductive contacts on a first side of the transaction card" should be changed to -- The transaction card of claim 8, further comprising: first conductive contacts on a first side of the transaction card --.

In Claim 13, Column 12, Line 63, "The transaction card of claim 12, further comprising: first conductive contacts on a first side of the transaction card, and second conductive contacts on a second side of the transaction card" should be changed to -- The transaction card of claim 12, further comprising: second conductive contacts on a second side of the transaction card --.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*